US012721083B2

(12) United States Patent
Shimomura

(10) Patent No.: US 12,721,083 B2
(45) Date of Patent: Aug. 25, 2026

(54) SUBSTRATE PROCESSING APPARATUS AND SUBSTRATE PROCESSING METHOD

(71) Applicant: Tokyo Electron Limited, Tokyo (JP)

(72) Inventor: Shinichiro Shimomura, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1028 days.

(21) Appl. No.: 17/929,340

(22) Filed: Sep. 2, 2022

(65) Prior Publication Data

US 2023/0073624 A1 Mar. 9, 2023

(30) Foreign Application Priority Data

Sep. 7, 2021 (JP) ................................ 2021-145691

(51) Int. Cl.
*H10P 72/00* (2026.01)
*H10P 70/00* (2026.01)

(52) U.S. Cl.
CPC .......... *H10P 72/0408* (2026.01); *H10P 70/80* (2026.01)

(58) Field of Classification Search
CPC ............. H01L 21/6703; H01L 21/6705; H01L 21/6701
USPC ............ 134/21, 108, 30, 186, 34, 36, 42, 61
See application file for complete search history.

(56) References Cited

U.S. PATENT DOCUMENTS 6,228,563 B1 * 5/2001 Starov .................... G03F 7/427 430/327
8,845,816 B2 * 9/2014 Diaz ........................ B08B 5/00 134/22.18
2012/0247516 A1 * 10/2012 Sato ......................... F26B 3/02 34/201
2019/0051519 A1 * 2/2019 Tsukano ............ H01L 21/67028
2020/0168482 A1 * 5/2020 Inadomi ............ H01L 21/67034
2020/0227253 A1 7/2020 Park et al.

FOREIGN PATENT DOCUMENTS

| | | | |
|---|---|---|---|
| JP | 2002-336675 | A | 11/2002 |
| JP | 2004-510321 | A | 4/2004 |
| JP | 2011-192835 | A | 9/2011 |
| JP | 2018-074103 | A | 5/2018 |
| JP | 2019-067863 | A | 4/2019 |
| JP | 2020-126974 | A | 8/2020 |

(Continued)

OTHER PUBLICATIONS

English translation of KR 20180055731 by PE2E.*

*Primary Examiner* — Deming Wan

(74) *Attorney, Agent, or Firm* — Chrisman Gallo Tochtrop LLC

(57) ABSTRACT

A substrate processing apparatus includes: a processing vessel having an opening; a cover body configured to close the opening; a cover body moving mechanism configured to move the cover body between a closed position and an open position; a substrate holder configured to horizontally hold a substrate; a fluid supply device configured to supply a processing fluid in a supercritical state and a fluid in a gas state to the processing vessel; and a controller configured to control the fluid supply device such that the processing fluid is supplied to the processing vessel in a first state in which the substrate is held by the substrate holder and the cover body is located at the closed position, and such that the fluid is supplied to the processing vessel in a second state in which the cover body is located at the open position.

17 Claims, 7 Drawing Sheets

(56) References Cited

FOREIGN PATENT DOCUMENTS

| | | | | |
|---|---|---|---|---|
| KR | 10-2002-0093556 | A | | 12/2002 |
| KR | 10-2017-0137245 | A | | 12/2017 |
| KR | 20180055731 | A | * | 5/2018 |
| WO | 01/87505 | A1 | | 11/2001 |

* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2021-145691 filed on Sep. 7, 2021, the entire disclosure of which is incorporated herein by reference.

TECHNICAL FIELD

The various aspects and embodiments described herein pertain generally to a substrate processing apparatus and a substrate processing method.

BACKGROUND

In the manufacture of a semiconductor device in which a stacked structure of integrated circuits is formed on a front surface of a substrate such as a semiconductor wafer, a liquid processing such as chemical liquid cleaning or wet etching is performed. In order to more reliably suppress a collapse of a pattern which is getting further miniaturized in recent years, a drying method using a processing fluid in a supercritical state is used in a drying process, which is a final process of the liquid processing (see, for example, Patent Document 1).

Patent Document 1: Japanese Patent Laid-open Publication No. 2018-074103

SUMMARY

In one exemplary embodiment, a substrate processing apparatus is configured to dry a substrate, a liquid being accumulated on a front surface of the substrate, by using a supercritical drying technique. The substrate processing apparatus includes: a processing vessel having an opening through which the substrate is carried into or carried out of the processing vessel; a cover body configured to be moved and configured to close the opening of the processing vessel; a cover body moving mechanism configured to move the cover body between a closed position where the cover body closes the opening and an open position where the cover body opens the opening; a substrate holder configured to horizontally hold the substrate with the front surface facing upwards in the processing vessel; a fluid supply device configured to supply a processing fluid in a supercritical state and a fluid in a gas state composed of a same material as the processing fluid in the supercritical state to the processing vessel, the fluid supply device comprising at least one supply line and at least one flow control device; and a controller configured to control the fluid supply device such that the processing fluid in the supercritical state is supplied to the processing vessel in a first state in which the substrate is held by the substrate holder within the processing vessel and the cover body is located at the closed position, and such that the fluid in the gas state is supplied to the processing vessel in a second state in which the substrate is not held by the substrate holder within the processing vessel and the cover body is located at the open position.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 1 is a schematic longitudinal sectional view of a supercritical drying unit according to an exemplary embodiment of a substrate processing apparatus;

FIG. 2 is a schematic transversal sectional view of the supercritical drying unit, taken along a line II-II of FIG. 1;

FIG. 3 is a schematic longitudinal sectional view of the supercritical drying unit, illustrating a state in which a purge process is being performed in the supercritical drying unit;

DETAILED DESCRIPTION

Figure 4:
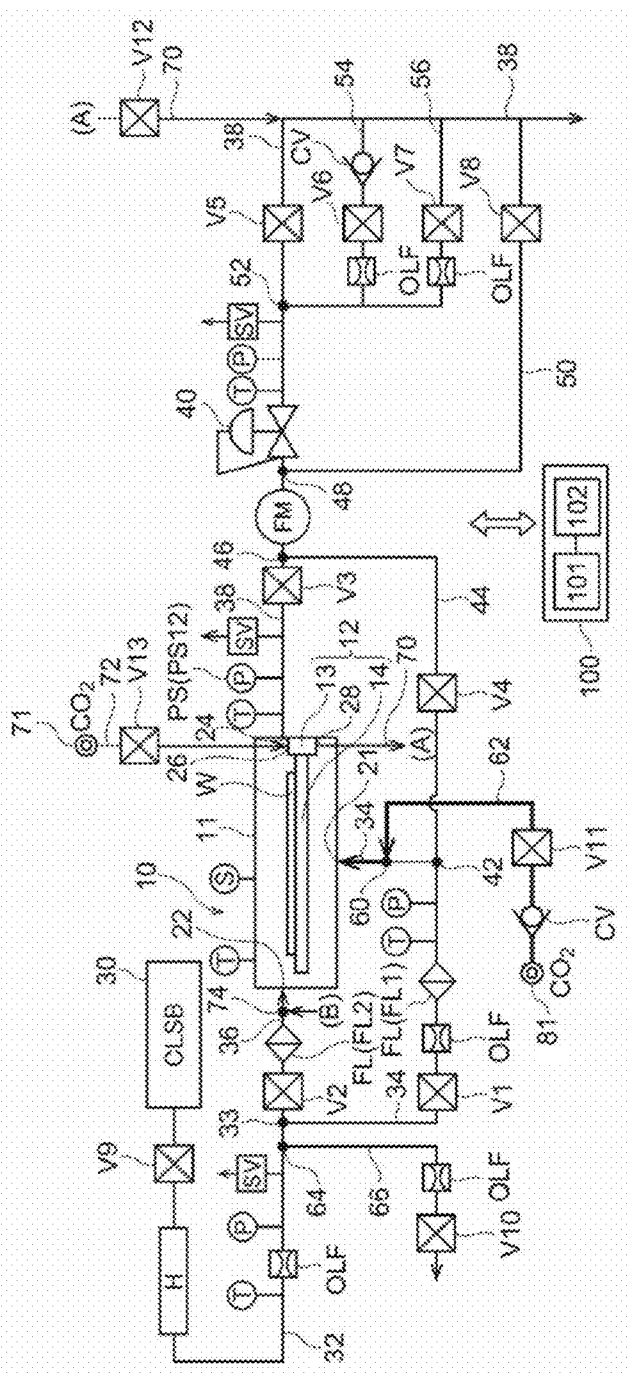
FIG. 4 is a diagram illustrating a pipeline system or the like for supplying/draining a fluid to/from a processing vessel.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 1:
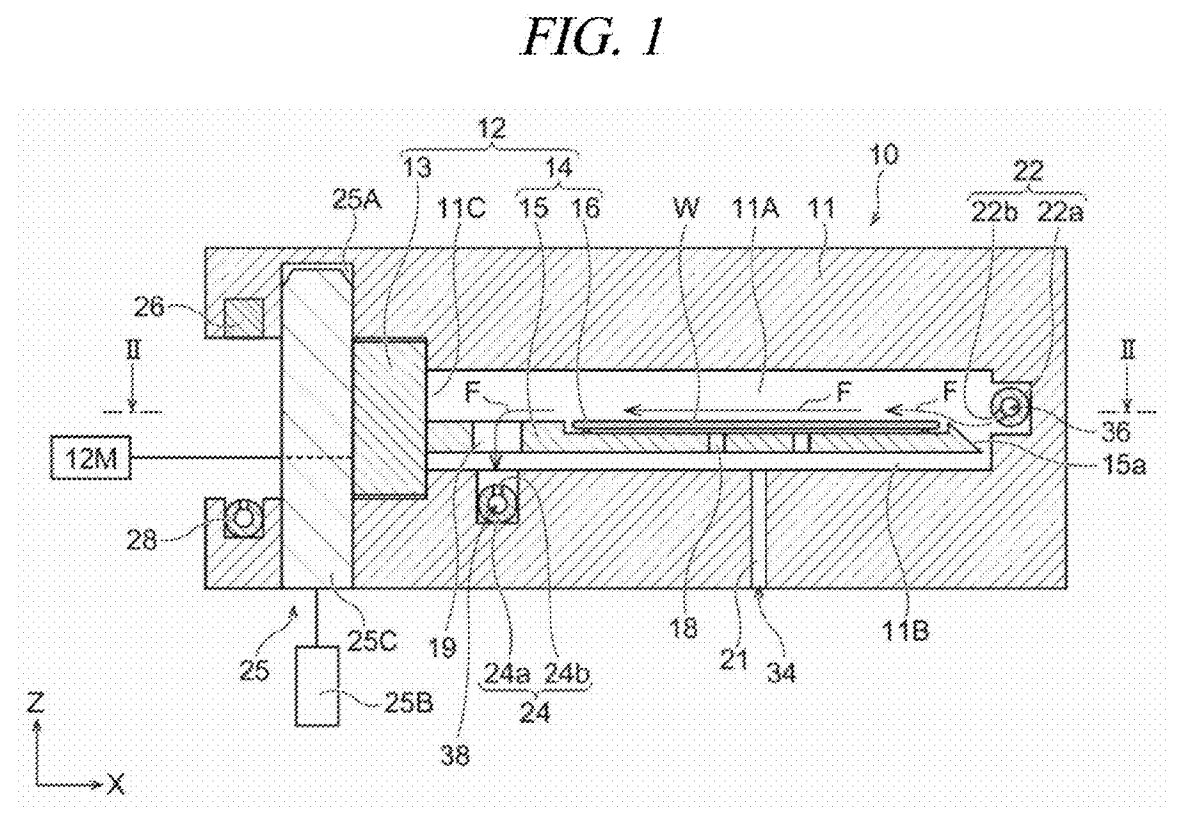

A configuration of a supercritical drying apparatus as one exemplary embodiment of a substrate processing apparatus will be described with reference to FIG. 1 to FIG. 4. The supercritical drying apparatus may be used to perform a supercritical drying processing of drying a substrate W having a liquid film of a liquid (for example, isopropyl alcohol (IPA)) on a front surface thereof with a processing fluid (for example, carbon dioxide) in a supercritical state.

The substrate W is, for example, a semiconductor wafer, or may be any of various kinds of substrates (a glass substrate, a ceramic substrate, etc.) for use in the technical field of semiconductor device manufacturing. A supercritical drying technique can be advantageously used in drying a substrate on which a fine and high-aspect-ratio pattern is formed in that a surface tension that may cause a pattern collapse does not act on the pattern.

In the following description, in order to ease the explanation of directions and positions, an XYZ orthogonal coordinates system is set, and the description will be provided with reference to this coordinates system when necessary. Further, it should be noted that the X direction will sometimes be referred to as a front-back direction (the positive X side is the front), the Ys direction will sometimes be referred to as a left-right direction (the positive Y side is the left), and the Z direction will sometimes be referred to as an up-down direction (the positive Z side is the upside).

The supercritical drying apparatus is equipped with a processing unit 10. The supercritical drying processing is performed in the processing unit 10. The processing unit 10 includes a processing vessel 11; and a substrate holding tray 12 (hereinafter, simply referred to as "tray 12") configured to hold the substrate W within the processing vessel 11.

The tray 12 is equipped with a cover 13 configured to close an opening 11*c* provided in a sidewall of the processing vessel 11; and a substrate holder 14 connected as one body with the cover (cover body) 13 and extending in a horizontal direction. The substrate holder 14 has a plate 15 and a plurality of supporting pins 16 provided on a top surface of the plate 15. The substrate W is horizontally placed on the supporting pins 16 with a front surface thereof (a surface on which a device or a pattern is formed) facing upwards. If the substrate W is placed on the supporting pins 16, a gap 17 is formed between the top surface of the plate 15 and a bottom surface (rear surface) of the substrate W.

The plate 15 as a whole has, for example, a rectangular or square shape. The area of the plate 15 is larger than that of the substrate W. When the substrate W is placed at a preset position on the substrate holder 15, the substrate W is completely covered with the plate 15 when the plate 15 is viewed from directly below.

The plate 15 is provided with a plurality of through holes 18 vertically formed through the plate 15. The plurality of through holes 18 serve to introduce a processing fluid supplied in a space below the plate 15 into a space above the plate 15. Some of the plurality of through holes 18 also serve to allow lift pins (marked by a reference numeral 300 in a lower part of FIG. 6), which are configured to deliver the substrate W between the substrate holder 14 and a substrate transfer mechanism (not shown) outside the processing unit 10, to pass therethrough. In the present specification, however, a detailed description thereof will be omitted.

The tray 12 is configured to be moved in the horizontal direction (X direction) by a tray moving mechanism 12M (schematically illustrated only in FIG. 1) between a closed position (the position shown in FIG. 1 and FIG. 2) and an open position. Although not shown in detail, the tray moving mechanism 12M may be composed of, by way of example, a guide rail extending in the X direction; and a moving body coupled to the cover 13 and configured to be moved along the guide rail.

When the tray 12 is placed at the closed position, the substrate holder 14 is located in an internal space of the processing vessel 11, and the cover 13 closes the opening of the sidewall of the processing vessel 11. When the tray 12 is placed at the open position, the substrate holder 14 is located outside the processing vessel 11 (see FIG. 6), and the substrate W can be transferred between the substrate holder 14 and a non-illustrated substrate transfer arm via the lift pins mentioned above. Further, when the tray 12 is placed at the open position, the cover 13 opens the opening 11C of the side wall of the processing vessel 11. In this sense, the tray moving mechanism 12M may also be referred to as a cover body opening/closing mechanism.

When the tray 12 is located at the closed position, the internal space of the processing vessel 11 is divided by the plate 15 into an upper space 11A above the plate 15, where the substrate W is present during a processing; and a lower space 11B below the plate 15. However, the upper space 11A and the lower space 11B are not completely separated.

That is, in the illustrated exemplary embodiment, the upper space 11A and the lower space 11B communicate with each other through the above-described through holes 18 and an elongated hole 19 (which is also a through hole) provided near a joint portion between the plate 15 and the cover 13. The upper space 11A and the lower space 11B are also allowed to communicate with each other through a gap between an edge of the plate 15 and an inner wall surface of the processing vessel 11. The gap, the through holes 18 and the elongated hole 19 described above may also be referred to as a communication path through which the upper space 11A and the lower space 11B communicate with each other.

Instead of the tray 12 which is configured to be movable, a substrate placing table (substrate holder) fixed immovably in the processing vessel 11 may be provided. In this case, with a non-illustrated cover provided at the processing vessel 11 opened, a non-illustrated substrate transfer arm may advance into a vessel main body to transfer the substrate W between the substrate placing table and the substrate transfer arm.

The processing vessel 11 is provided with a first discharge unit 21 and a second discharge unit 22. The first discharge unit 21 and the second discharge unit 22 are configured to discharge the processing fluid (in this example, the carbon dioxide (hereinafter, sometimes referred to as "$CO_2$" for the purpose of simplicity)) supplied from a source 30 of a supercritical fluid (processing fluid in a supercritical state) into the internal space of the processing vessel 11.

It should be noted that the ordinal numbers ("first", "second" . . . ) assigned to the names of constituent components (for example, the "discharge units") mentioned in the description of the exemplary embodiment and the ordinal numbers assigned to the names of the corresponding constituent components described in the claims do not necessarily match.

The first discharge unit 21 is provided below the plate 15 of the tray 12 placed at the closed position. The first discharge unit 21 discharges the $CO_2$ (processing fluid) into the lower space 11B toward a bottom surface of the plate 15 (upwards). The first discharge unit 21 may be configured by a through hole formed through a bottom wall of the processing vessel 11. Also, the first discharge unit 21 may be a nozzle mounted to the bottom wall of the processing vessel 11.

The second discharge unit 22 is provided so as to be located in front of the substrate W (that is, located at a position ahead of the substrate W in the positive X direction) placed on the substrate holder 14 of the tray 12 which is located at the closed position. The second discharge unit 22 supplies the $CO_2$ into the upper space 11A. In the illustrated exemplary embodiment, the second discharge unit 22 is provided in a sidewall of the processing vessel 11 opposite to the sidewall where the cover 13 is provided.

The second discharge unit 22 is configured by a rod-shaped nozzle body. In detail, the second discharge unit 22 is formed by drilling a plurality of discharge openings 22*b* in a tube 22*a* extending in a width direction of the substrate W (Y direction). The plurality of discharge openings 22*b* are arranged at an equal distance therebetween in the Y direction, for example. The $CO_2$ is supplied through each discharge opening 22*b* into the upper space 11A toward the opening 11C side (approximately in the negative X direction).

The processing vessel 11 is further equipped with a fluid drain unit 24 configured to drain the processing fluid from the internal space of the processing vessel 11. The fluid drain unit 24 is configured as a header having substantially the same configuration as the second discharge unit 22. In detail, the fluid drain unit 24 is formed by drilling a plurality of drain openings 24*b* in a tube 24*a* extending in the horizontal direction. The plurality of drain openings 24*b* are arranged at an equal distance therebetween in the Y direction, for example. Each drain opening 24*b* faces upwards toward the elongated hole 19 of the plate 15.

In the illustrated exemplary embodiment, the fluid drain unit 24 is provided in a recess formed, near the opening 11C, in the bottom wall of the processing vessel 11. As indicated by an arrow F in FIG. 1, after passing through the region above the substrate W in the upper space 11A, the $CO_2$ is flown into the lower space 11B through the communication path (or the through hole 19 formed in the plate 15) and then drained from the fluid drain unit 24.

The layout of the second discharge unit 22 and the fluid drain unit 24 is not limited to the illustrated example, and they may be disposed at any positions as long as the $CO_2$ supplied from the second discharge unit 22 into the processing vessel 11 can be drained from the fluid drain unit 24 after passing through the region above the approximately entire front surface of the substrate W in the substantially horizontal direction. As a specific example, the second discharge unit 22 and the fluid drain unit 24 may be disposed on both sides of the substrate W in the left-right direction (Y direction) with the substrate W therebetween. Alternatively, instead of the fluid drain unit 24 shown in FIG. 1, a fluid drain unit having the same configuration as the fluid drain unit 24 (except that a drain opening thereof faces downwards) may be provided on a ceiling wall of the processing vessel 11.

Figure 3:
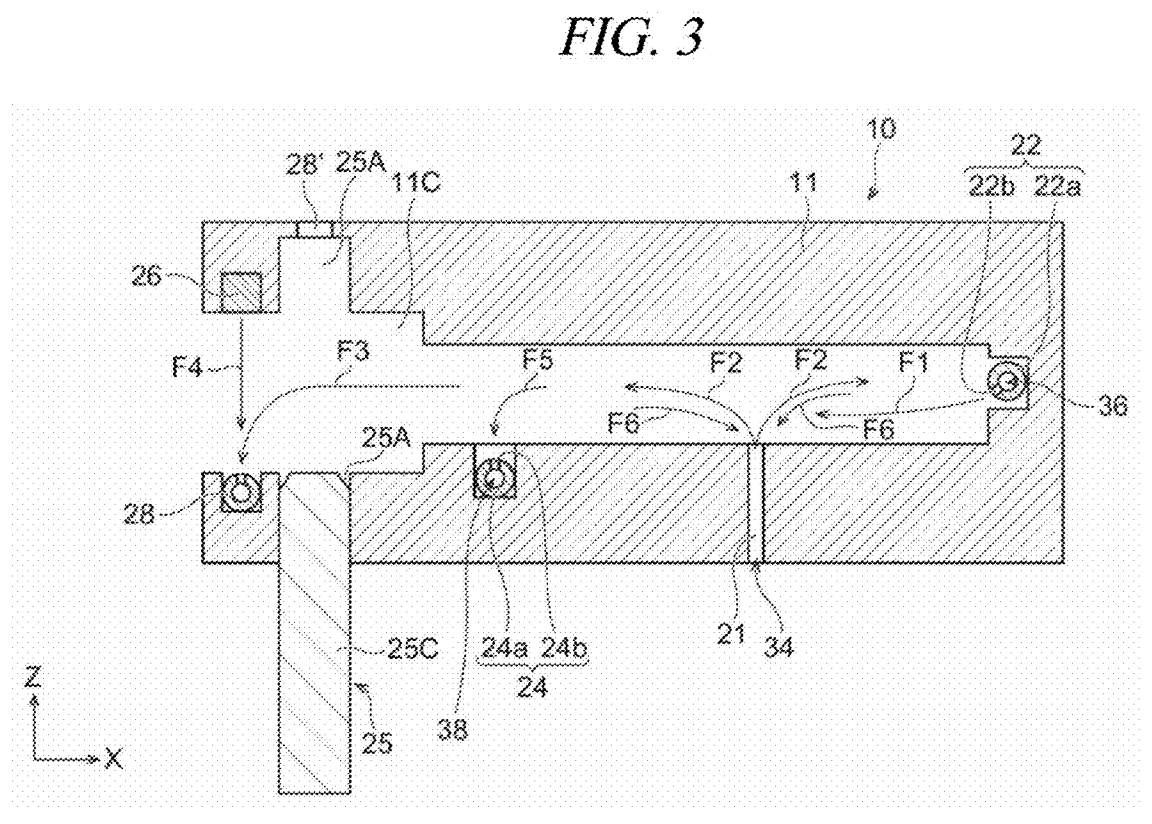

The processing unit 10 is equipped with a lock mechanism 25 configured to fix the tray 12 at the closed position. The lock mechanism 25 includes a guide hole 25A formed in the processing vessel 11; and a latch-shaped lock member 25C configured to be moved in a vertical direction (Z direction) by an elevating mechanism 25B (for example, an air cylinder or a ball screw) along the guide hole 25A. In FIG. 3, the lock member 25C located at a lowered position (unlocking position) is shown. If the lock member 25C is moved to a raised position (locking position) shown in FIG. 1 after the tray 12 is moved to the closed position, the tray 12 is not moved in an opening direction (negative X direction) even if the internal pressure of the processing vessel 11 increases.

A gas collecting unit 28 is disposed at a position near the opening 11C of the processing vessel 11 (for example, in a region 29A or 29B of FIG. 2) to collect the $CO_2$ flown out from the opening 11C or the CO2 gas that is about to be flown out therefrom in a purge process to be described later. The main reason for providing this gas collecting unit 28 is to comply with safety regulations regarding a $CO_2$ concentration.

The gas collecting unit 28 may be disposed in a proper component of the processing unit 10 near the opening 11C (for example, the lock member 25C, the wall of the processing vessel 11, the inside of the guide hole 25A, etc.). The gas collecting unit 28 may be configured as a header having substantially the same configuration as the fluid drain unit 24.

Figure 2:
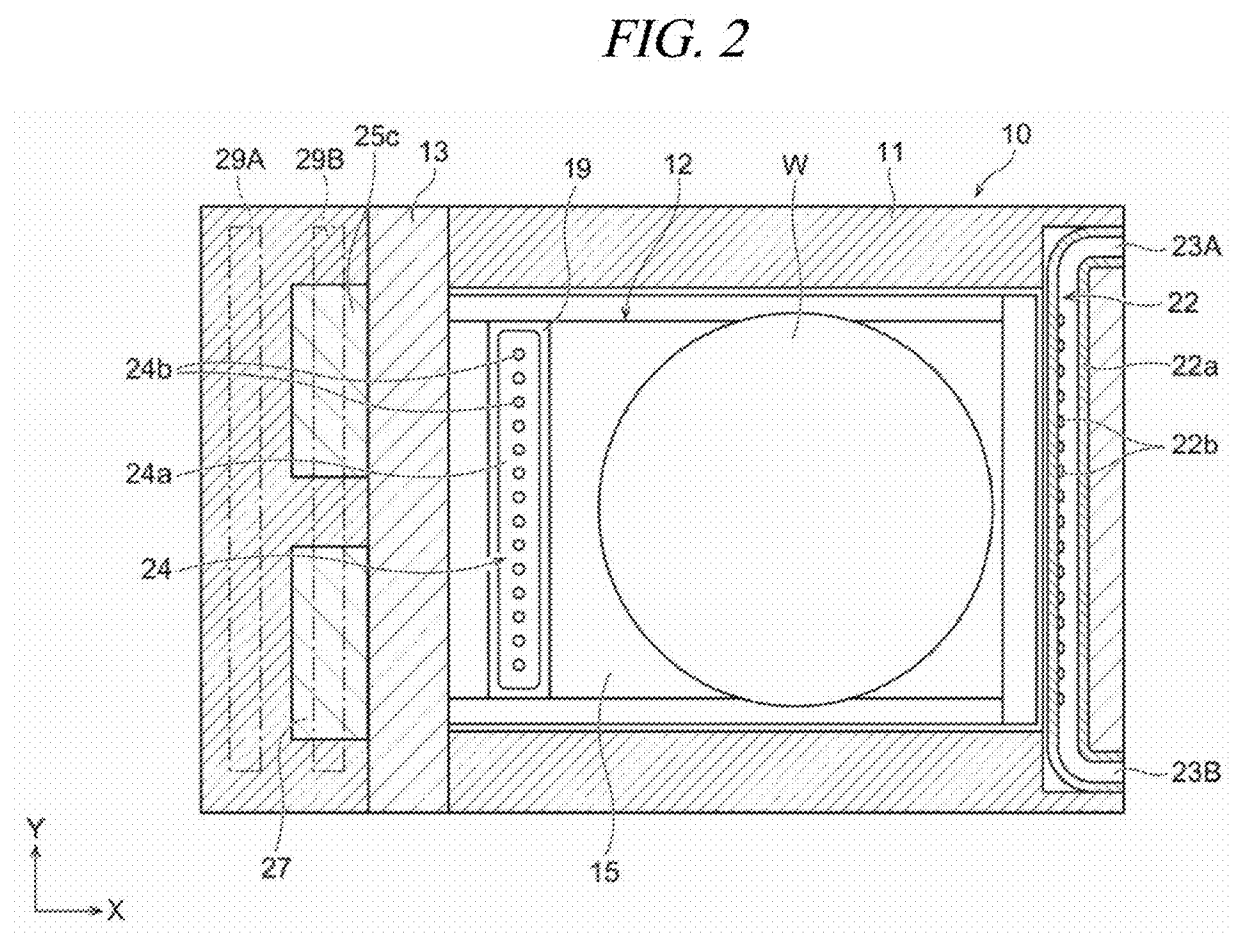

FIG. 1 and FIG. 3 illustrate the gas collecting unit 28 provided in the region 29A of FIG. 2. The gas collecting unit 28 described here is configured by a tube having the same configuration as the fluid drain unit 24 provided in the recess formed in the region 29A shown in FIG. 2 (this tube has a plurality of upwardly opened suction openings arranged in the Y direction).

When the gas collecting unit 28 is provided, for example, in the region 29B shown in FIG. 2, it may be provided in a wall of the processing vessel 11 facing the lock member 25C in the vertical direction, not at the lock member 25C. Although it is also possible to provide it in a top surface of the lock member 25C, a pipeline connected to the gas collecting unit 28 is complicated if the gas collecting unit 28 is provided in the lock member 25C which is the movable member.

The gas collecting unit 28 may be provided in a wall of the processing vessel 11 on the opposite side (upper side) from the position shown in FIG. 1 and FIG. 3 (for example, a position indicated by a reference numeral 28' in FIG. 3).

A curtain gas discharge unit 26 configured to discharge a shield gas downwards may be provided at a position opposed to the gas collecting unit 28 in the vertical direction. The curtain gas discharge unit 26 may also be configured as a header having substantially the same configuration as the gas collecting unit 28. A gas curtain can be formed in front of the opening 11C by the shield gas discharged from the curtain gas discharge unit 26. By forming the gas curtain, when the tray 12 is placed at the open position, it is possible to suppress the atmosphere (air) from reaching the processing vessel 11 through the opening 11C. The shield gas forming the gas curtain is a $CO_2$ gas, which is the same gas as the processing fluid and a purge gas. It is also possible to provide the gas collecting unit 28 at the upper side and the curtain gas discharge unit 26 at the lower side.

Now, a supply/drain system configured to supply/drain the $CO_2$ to/from the processing vessel 11 in the supercritical drying apparatus will be described with reference to FIG. 4. In FIG. 4, for the simplicity of illustrations, the processing unit 10 is shown in a greatly simplified manner, the left and right sides are inverted from those of the processing unit 10 shown in FIG. 1 to FIG. 3, and the fluid drain unit 24 is illustrated at a position different from the actual position thereof.

In a pipeline system diagram shown in FIG. 4, a member indicated by an encircled T is a temperature sensor, and a member indicated by an encircled P is a pressure sensor. A member with a notation OLF is an orifice (fixed throttle), and it serves to reduce the pressure of the $CO_2$ flowing in a pipeline downstream thereof to a required value. A member denoted by SV surrounded by a square is a safety valve (relief valve), which serves to suppress a damage on the constituent component of the supercritical processing apparatus such as the pipeline or the processing vessel 11 due to an unpredictable overpressure. A member marked with a notation F is a filter, and it serves to remove a contaminant such as a particle included in the $CO_2$. A member marked with a notation CV is a check valve. A member indicated by an encircled FM is a flowmeter. A member denoted by H surrounded by a square is a heater configured to adjust the temperature of the $CO_2$. When it is necessary to distinguish any one of the above-described various members from the others, a number will be added to the end of the alphabets thereof (for example, "filter (FL2)"). A member assigned with a notation VN (N is a natural number) is an opening/closing valve, and thirteen opening/closing valves V1 to V13 are illustrated in FIG. 1.

The supercritical drying apparatus has a supercritical fluid supply device (first fluid supply) 30 as a source for the supercritical processing fluid (supercritical $CO_2$). The supercritical fluid supply device 30 has a commonly-known configuration including, for example, a carbon dioxide gas cylinder, a booster pump, a heater, and the like. The supercritical fluid supply device 30 is capable of sending the $CO_2$ at a pressure exceeding a supercritical state assurance pressure (specifically, about 16 MPa), which will be described later.

A main supply line 32 is connected to the supercritical fluid supply device 30. The $CO_2$ in the supercritical state is sent from the supercritical fluid supply device 30 into the main supply line 32, and this supercritical $CO_2$ may be turned into a gas state as a result of a pressure variation or a temperature variation that occurs afterwards. In the present specification, a member called a "line" may be configured by a pipeline (pipe member).

The main supply line 32 is branched into a first supply line 34 and a second supply line 36 at a branch point (first branch point) 33. The first supply line 34 is connected to the first discharge unit 21 of the processing vessel 11. The second supply line 36 is connected to the second discharge unit 22 of the processing vessel 11.

A drain line 38 is connected to the fluid drain unit 24 of the processing vessel 11. The drain line 38 is provided with a valve (regulating valve) 40 capable of adjusting an opening degree thereof. By adjusting the opening degree of the valve 40, a primary pressure of the valve 40 can be adjusted, and, thus, the internal pressure of the processing vessel 11 can be adjusted. By adjusting the opening degree of the valve 40, it is also possible to adjust a drain rate of the processing fluid from the processing vessel 11.

Although not illustrated in FIG. 4, the second supply line 36 is bifurcated near a connection point to the second discharge unit 22 (downstream of the filter FL2), and the ends of the bifurcated lines are respectively connected to opposite ends 23A and 23B of the tube 22*a* of the second discharge unit 22 shown in FIG. 2. Accordingly, a pressure distribution in a lengthwise direction of the tube 22*a* is uniformed, so that the processing fluid is discharged from the respective discharge openings 22*b* in a substantially uniform manner. Likewise, the drain line 38 is also bifurcated near a connection point to the fluid drain unit 24 (upstream of the relief valve SV), and the ends of the bifurcated lines are respectively connected to opposite ends of the tube 24*a*. Accordingly, the processing fluid is flown into the pipe 24*a* from the respective drain openings 24*b* in a substantially uniform manner. In addition, the temperature sensor T and the pressure sensor PS12 only need to be provided at either one of the two bifurcated lines.

The controller 100 schematically illustrated in FIG. 4 performs a feedback control over the opening degree of the valve 40 (specifically, a position of a valve body) based on a deviation between a measurement value PV and a set value SV of the internal pressure of the processing vessel 11 to maintain the internal pressure of the processing vessel 11 at the set value. For example, a detection value of a pressure sensor, which is assigned with a notation PS and disposed between the opening/closing valve V3 of the drain line 38 and the processing vessel 11, as shown in FIG. 4, may be used as the measurement value of the internal pressure of the processing vessel 11. That is, the interval pressure of the processing vessel 11 may be directly measured by a pressure sensor provided in the processing vessel 11, or indirectly measured by a pressure sensor PS12 which is provided outside the processing vessel 11 (in the drain line 38, for example).

The controller 100 is, for example, a computer, and includes an operation unit 101 and a storage 102. The storage 102 stores therein a program for controlling various kinds of processings performed in the supercritical drying apparatus (or the substrate processing system including the supercritical drying apparatus). The operation unit 101 controls the operation of the supercritical drying apparatus by reading and executing the program stored in the storage 102. The program may be recorded on a computer-readable recording medium and installed from this recording medium to the storage 102 of the controller 100. Examples of the computer-readable recording medium include a hard disk (HD), a flexible disk (FD), a compact disk (CD), a magnet optical disk (MO), a memory card, and so forth.

At a branch point 42 set on the first supply line 34, a bypass line 44 is branched from the first supply line 34. The bypass line 44 is connected to the drain line 38 at a connection point (junction point) 46 set in the drain line 38. The connection point 46 is located upstream of the regulating valve 40.

At a branch point 48 set on the drain line 38 upstream of the regulating valve 40, a branch drain line 50 is branched from the drain line 38, and joins the drain line 38 again. At a branch point 52 set on the drain line 38, two branch drain lines 54 and 56 are branched from the drain line 38. Downstream ends of the branch drain lines 54 and 56 join the drain line 38 again. A downstream end of the drain line 38 is connected to, for example, a fluid collecting device (not shown). A useful component (for example, IPA (isopropyl alcohol)) contained in the $CO_2$ collected by the fluid collecting device is appropriately separated to be reused. A downstream end of the branch drain line 50 may be opened to the atmosphere without being merged to the drain line 38.

A drain line 66 through which the processing fluid is drained is branched from a branch point (second branch point) 64 set on the main supply line 32 immediately upstream of the branch point (first branch point) 33.

A purge gas supply line 62 is connected to a joint point 60 set on the first supply line 34 between the branch point 42 and the processing vessel 11. A purge gas source (second fluid supply) 81 is connected to the purge gas supply line 62. The purge gas can be supplied into the processing vessel 11 from the purge gas source 81 via the purge gas supply line 62, the joint point 60, the first supply line 34, and the first discharge unit 21. The gas supplied from the purge gas source 81 is the same material as the processing fluid used in supercritical drying, and differs only in phase. Specifically, here, the processing fluid used in the supercritical drying process is $CO_2$ in the supercritical state (supercritical phase), and the purge gas supplied from the purge gas source 81 is $CO_2$ in the gas state (gas phase).

The purge gas source 81 and the purge gas supply line 62 (a check valve CV and the opening/closing valve V11 provided therein) connected thereto are connected to a joint point 74 set on the second supply line 36 (see (B) in FIG. 4). In this case, the purge gas is introduced into the processing vessel 11 from the second discharge unit 22.

A gas collecting line 70 provided with the opening/closing valve V12 is connected to the gas collecting unit 28, and this gas collecting line may be connected to the drain line 38 at the downstream of the opening/closing valve V5, for example. In FIG. 4, for the readability of the drawing, the gas collecting line 70 is cut off at a point (A).

$CO_2$ in the gas state (gas phase) ($CO_2$ gas) may be supplied to the curtain gas discharge unit 26 from a curtain gas source 71 (third fluid supply) through a curtain gas supply line 72 provided with the opening/closing valve V13. Alternatively, the $CO_2$ in the gas state (gas phase) ($CO_2$ gas) may be supplied from the purge gas source 81 to the curtain gas discharge unit 26. In this case, a curtain gas supply line (not shown) provided with an opening/closing valve may be branched from the purge gas supply line 62, and this curtain gas supply line may be connected to the curtain gas discharge unit 26.

Now, an example of a supercritical drying method (substrate processing method) using the above-described supercritical drying apparatus will be briefly described. A sequence described below is automatically executed under the control of the controller 100 based on the processing recipe and the control program stored in the storage 102.

[Purge Process and Substrate Carrying-In Process]

Before carrying the substrate W such as a semiconductor wafer into the processing vessel 11, the tray 12 is moved to the open position. That is, the cover (cover body) 13 of the tray 12 opens the opening 11C of the processing vessel 11. Then, by a well-known method, the substrate W is placed on the substrate holder 14 of the tray 12 placed at the open position. By way of example, as the lift pins located at the raised position (see the lift pins 300 located at the lowered position shown in FIG. 6) are lowered after they receive the substrate W from the non-illustrated substrate transfer arm, the substrate W can be placed on the substrate holder 14.

In addition, the substrate W placed on the tray 12 is to be subjected to (1) a chemical liquid processing such as wet etching or chemical cleaning, (2) a rinsing processing of washing off a chemical liquid with a rinse liquid, and (3) an IPA replacement processing of replacing the rinse liquid with IPA to form a puddle (liquid film) of the IPA. With the puddle of the IPA formed on the surface thereof, the substrate W is placed on the tray 12.

A purge process of purging the internal space of the processing vessel 11 with a $CO_2$ gas is performed after the tray 12 is moved to the open position, until the tray 12 holding the substrate W is returned back to the closed position. The purge process will be elaborated later.

After the purge process is performed, if the processing vessel 11 is hermetically sealed by the cover 13 as the tray 12 holding the substrate W is returned back to the closed position, a supercritical processing is started. Individual processes of the supercritical processing will be briefly described below with reference to FIG. 5A to FIG. 5E. In FIG. 5A to FIG. 5E, the opening/closing valves painted in gray are in a closed state, and the opening/closing valves not painted in color are in an open state. For the simplicity of the drawings, illustration of gas lines and flow regulating devices (opening/closing valves, etc.) related to the purge process are omitted in FIG. 5A to FIG. 5E.

[Pressure Increasing Process]

First, a pressure increasing process is performed. The pressure increasing process is divided into a decelerated pressure increasing stage in an initial period and a normal pressure increasing stage thereafter.

<Decelerated Pressure Increasing Stage>

Figure 5A:
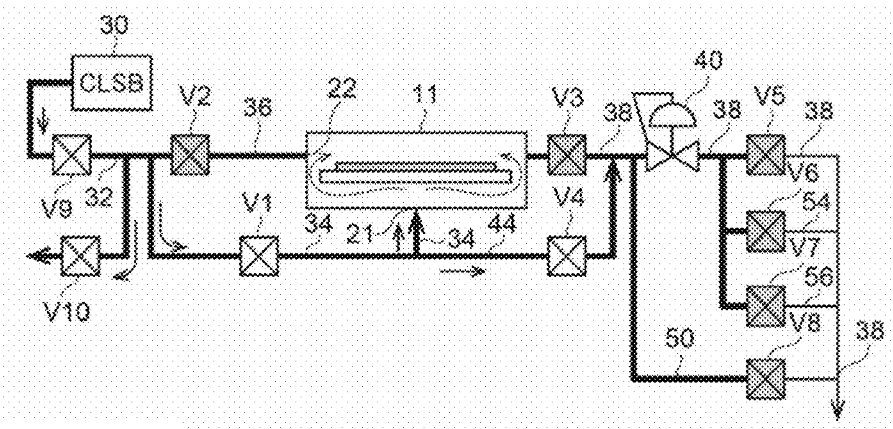
FIG. 5A is a diagram illustrating a process of a supercritical drying processing.

First, the individual opening/closing valves are put into the states shown in FIG. 5A, and the opening degree of the adjusting valve 40 is fixed to an appropriate fixed opening degree, for example, 2.5%. Some (for example, about 35%) of the $CO_2$ sent in the supercritical state from the supercritical fluid supply device 30 to the main supply line 32 is drained from a pressure release line 66 provided with an orifice OLF, and a remainder is introduced into the first supply line 34. Some (for example, about 35%) of the $CO_2$ flown into the first supply line 34 is introduced into the processing vessel 11 through the first discharge unit 21. Further, a remainder of the $CO_2$ flown through the first supply line 34 is introduced into the drain lines 38 and 50 through the bypass line 44 without being flown to the processing vessel 11 and blocked by the opening/closing valves V5 to V8 in the closed state.

Immediately after the beginning of the decelerated pressure increasing stage, the pressure of the $CO_2$ sent in the supercritical state from the supercritical fluid supply device 30 gradually decreases, and it decreases especially largely when the $CO_2$ is introduced into the processing vessel 11 in the normal pressure state having a relatively large volume. That is, in the initial period of the introduction of the $CO_2$ into the processing vessel 11, the pressure of the $CO_2$ in the processing vessel 11 is lower than a critical pressure (e.g., about 8 MPa), so that the $CO_2$ is in the gas state. Since a difference between the internal pressure of the first supply line 34 and the internal pressure of the processing vessel 11 in the normal pressure state is very large, the $CO_2$ in the gas state is introduced into the processing vessel 11 at a high flow rate, raising a risk that it may disturb the IPA puddle on the surface of the pattern to cause the pattern collapse.

In the decelerated pressure increasing stage, some of the $CO_2$ flowing through the main supply line 32 is sent into the pressure release line 66, and some of the $CO_2$ flowing through the first supply line 34 is sent into the bypass line 44. Therefore, the flow rate of the $CO_2$ introduced into the processing vessel 11 is reduced. The orifice OLF in the first supply line 34 also contributes to reducing the flow rate of the $CO_2$ introduced into the processing vessel 11. Further, after the $CO_2$ flown into the processing vessel 11 from the first discharge unit 21 collides with the plate 15 of the tray 12, it bypasses the plate 15 and reaches the upper space 11A in which the substrate W is present. Therefore, a flow velocity of the $CO_2$ gas flowing near the substrate W becomes low. By adopting this countermeasure, the possibility of the pattern collapse is greatly reduced.

If the internal pressure of the processing vessel 11 is raised to a certain extent, the flow rate of the $CO_2$ flown into the processing vessel 11 decreases, so that the pattern collapse that might be caused by the flow of the $CO_2$ around the substrate W at the high flow velocity becomes less likely to occur. Then, the processing proceeds to the normal pressure increasing stage.

<Normal Pressure Increasing Stage>

Figure 5B:
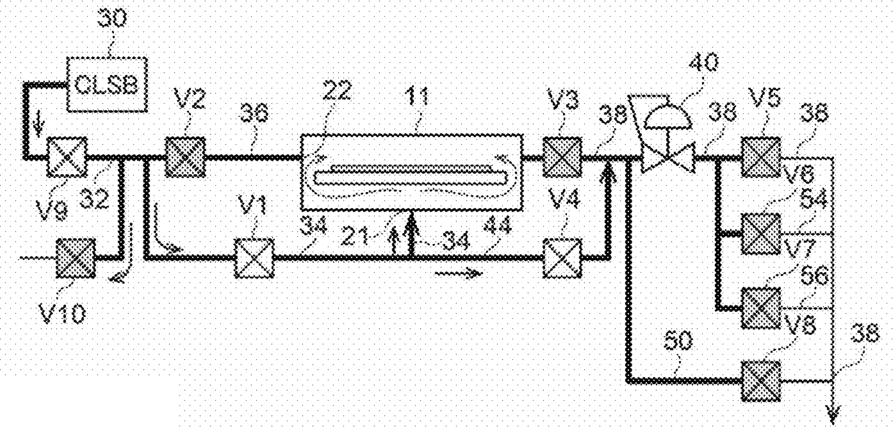
FIG. 5B is a diagram illustrating a process of the supercritical drying processing.

That is, the individual opening/closing valves are put into the states shown in FIG. 5B, and the draining of the $CO_2$ from the main supply line 32 through the pressure release line 66 is stopped. As a result, the internal pressure of the processing vessel 11 increases at a higher pressure increasing rate than that in the decelerated pressure increasing stage. At this time, internal pressures of the lines 44, 38, 50, 54 and 56 whose downstream ends are blocked by the opening/closing valves V5 to V8 also increase. By setting up this state, the internal pressure of the processing vessel 11 does not drop rapidly immediately after the processing proceeds to a flowing process.

If the internal pressure of the processing vessel 11 exceeds a threshold pressure (about 8 MPa) of the $CO_2$, the $CO_2$ (which is not mixed with the IPA) present in the processing vessel 11 is turned into the supercritical state. If the $CO_2$ in the processing vessel 11 is turned into the supercritical state, the IPA on the substrate W begins to be dissolved in the $CO_2$ in the supercritical state. This normal pressure increasing stage is continued until the internal pressure of the processing vessel 11 reaches a pressure (supercritical state assurance pressure) at which a mixed fluid ($CO_2$+IPA) is assured to be maintained in the supercritical state regardless of the concentration of the IPA in the mixed fluid on the substrate W and the temperature of the mixed fluid. The supercritical state assurance pressure is about 16 MPa.

<Flowing Process>

Figure 5C:
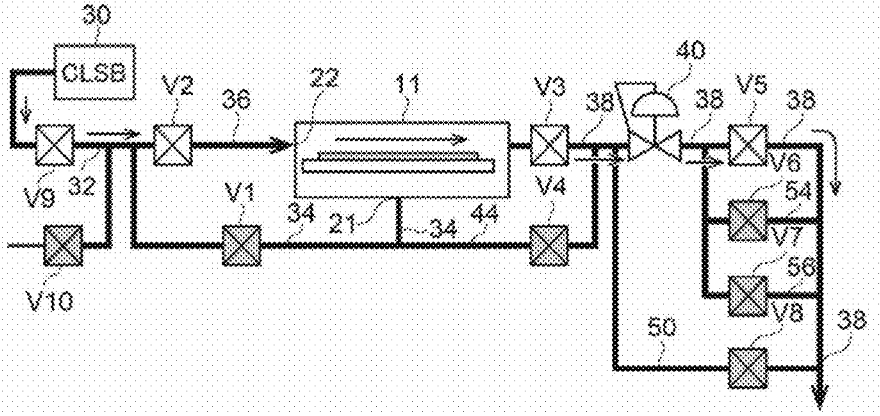
FIG. 5C is a diagram illustrating a process of the supercritical drying processing.

If it is detected by the pressure sensor P12 that the internal pressure of the processing vessel 11 has reached the supercritical state assurance pressure (16 MPa), the individual opening/closing values are turned into the states shown in FIG. 5C, and an operation mode of the adjusting valve 40 is switched to a feedback control mode. At this time, the controller 100 (or a subordinate controller thereof) performs a feedback control of adjusting the opening degree (manipulation amount MV) of the adjusting valve 40 based on the deviation between the internal pressure (measurement value PV) of the processing vessel 11 detected by the pressure sensor PS12 and the set value SV.

In the flowing process, the supercritical $CO_2$ supplied into the processing vessel 11 from the second discharge unit 22 flows through the region above the substrate, and then is drained from the fluid drain unit 24. At this time, a laminar flow of the supercritical $CO_2$ flowing substantially in parallel with the front surface of the substrate W is formed in the processing vessel 11. The IPA in the mixed fluid (IPA+$CO_2$) on the surface of the substrate W exposed to the laminar flow of the supercritical CO is replaced with the supercritical $CO_2$. Finally, almost all the IPA on the front surface of the substrate W is replaced with the supercritical $CO_2$.

The mixed fluid composed of the IPA and the supercritical $CO_2$ drained from the fluid drain unit 24 is collected after flowing through the drain line 38 (and the branch drain lines 54 and 56). The IPA contained in the mixed fluid can be separated to be reused.

<Draining Process>

Figure 5D:
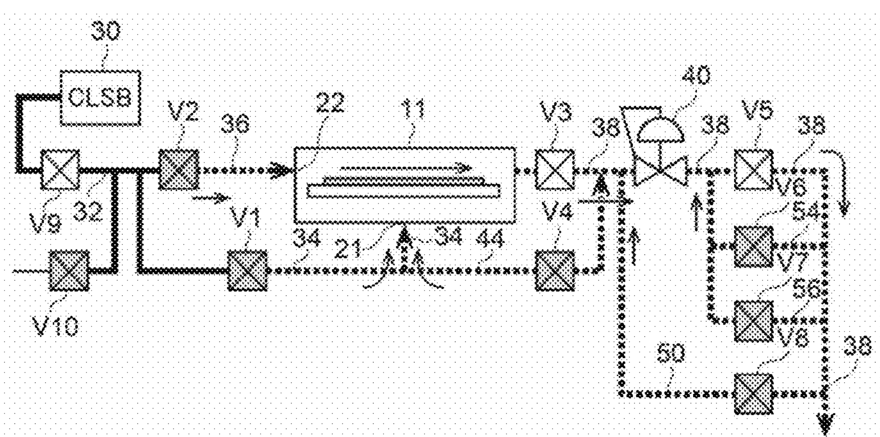
FIG. 5D is a diagram illustrating a process of the supercritical drying processing.
Figure 5E:
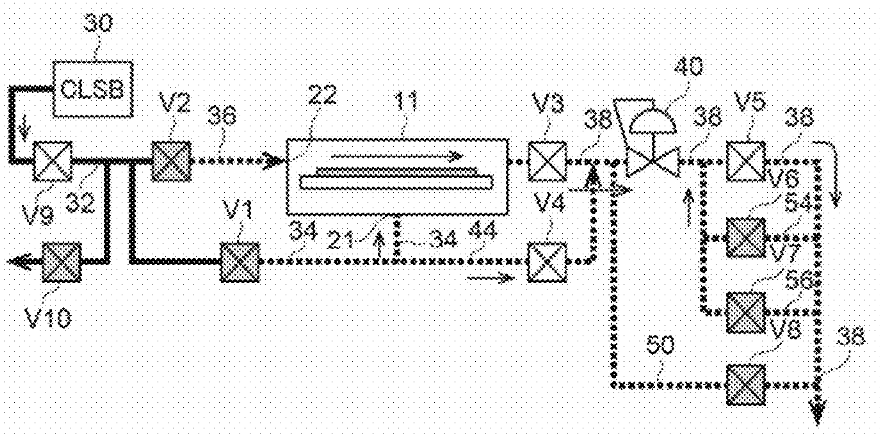
FIG. 5E is a diagram illustrating a process of the supercritical drying processing.

Upon the completion of the replacement of the IPA with the supercritical $CO_2$, the individual opening/closing valves are turned into the states shown in FIG. 5D in which the supply of the supercritical $CO_2$ into the processing vessel 11 is stopped, and the set pressure of the processing vessel 11 is lowered to the normal pressure. Accordingly, the opening degree of the adjusting valve 40 is greatly increased, so that the internal pressure of the processing vessel 11 falls down to the normal pressure. Along with this, the supercritical $CO_2$ present within the pattern of the substrate W is turned into the gas to be released from the pattern, and the $CO_2$ in this gas state is drained from the processing vessel 11. Finally, by turning the individual opening/closing valves are turned into the states shown in FIG. 5E, the $CO_2$ left between the opening/closing valve V1 and the opening/closing valve V4 is drained. Through these operations, the drying of the substrate W is completed.

<Substrate Carrying-Out Process>

The tray 12 on which the dried substrate W is placed is moved to the open position, and the substrate W is taken out of the processing unit 10 (from a housing in which the processing unit 10 is provided) by a commonly-known method. At this time, the above-described lift pins may lift up the substrate W from the tray 12 located at the open position, and then, the non-illustrated substrate transfer arm may receive the substrate W from the lift pins. Furthermore, the substrate transfer arm may place a next substrate W on the lift pins, and may carry on the substrate carrying-in process for the next substrate W. In this case as well, the purge process is performed while the tray 12 is placed at the open position.

[Purge Process]

Next, the purge process will be described in detail. The purge process is performed while the tray 12 is located at the open position to carry the substrate W into the processing vessel 11. If the opening 11C of the processing vessel 11 is opened, the atmosphere around the processing vessel 11 (typically, an atmospheric atmosphere) is introduced into the processing vessel 11 by, for example, mutual diffusion. Gases such as oxygen ($O_2$), nitrogen ($N_2$), water vapor ($H_2O$), ammonia, and so forth (for the convenience of explanation, the gases other than the carbon dioxide gas will be referred to as "impurity gas"), which are different from the carbon dioxide ($CO_2$) as the processing fluid, are included in the atmosphere. If the supercritical drying processing is started from a state in which the impurity gas exists in the processing vessel 11, there is a concern that foreign substances derived from the impurity gas may remain on the surface of the substrate after being subjected to the supercritical drying processing. Moreover, since critical temperatures and critical pressures of the water and the ammonia, especially, are higher than those of the carbon dioxide, there is a risk that a defect such as a pattern collapse may occur. To solve this potential problem, in the purge process, a $CO_2$ gas is supplied as a purge gas into the processing vessel 11 in the state that the processing vessel 11 is opened, in order to reduce a concentration of the impurity gas in the processing vessel 11.

First Exemplary Embodiment of Purge Process

In a first exemplary embodiment, the $CO_2$ gas (purge gas) is supplied from the purge gas source 81 via the purge gas supply line 62, the joint point 60, the first supply line 34, and the first discharge unit 21 through a route indicated by a thick line in FIG. 4. That is, the opening/closing valves V1, V2, V3, and V4 are closed, and the opening/closing valve V11 is opened. The states of the other opening/closing valves (opening/closing valves not directly involved in the flow of the fluid into/from the processing vessel) are not particularly limited. By way of example, they may be set into a state in which transition to the next process, that is, the pressure increasing process, can be smoothly carried out.

The $CO_2$ gas flown into the processing vessel 11 from the first discharge unit 21 is diffused into the processing vessel 11 as schematically indicated by, for example, an arrow F2 in FIG. 3, and flown out from the opening 11C of the processing vessel 11 as schematically indicated by an arrow F3. As a result, the concentration of the $CO_2$ gas in the processing vessel 11 increases, whereas the concentration of the impurity gas decreases.

At this time, the opening/closing valves V5, V6, V7 and V8 may be closed, and the opening/closing valve V12 may be opened. Since the drain line 38 is connected to the non-illustrated fluid collecting device and is set to have a negative pressure, a suction force acts in the gas collecting unit 28. For this reason, the $CO_2$ gas flown out from the opening 11C of the processing vessel 11 schematically indicated by the arrow F3 is sucked into the gas collecting unit 28 and then introduced into the fluid collecting unit via the gas collecting line 70 and the drain line 38. Since a strong suction force is applied by the gas collecting unit 28, a negative pressure generating device such as a suction pump or an ejector may be provided in the gas collecting line 70 or a flow path downstream thereof.

At this time, the opening/closing valve V13 may be opened to discharge the $CO_2$ gas (shield gas) from the curtain gas discharge unit 26. The $CO_2$ gas discharged from the curtain gas discharge unit 26 flows toward the gas collecting unit 28 as indicated by an arrow F4 in FIG. 3, forming the air curtain between the curtain gas discharge unit 26 and the gas collecting unit 28. Accordingly, the air outside the gas curtain is suppressed from reaching the inside of the gas curtain. Therefore, the purging efficiency is improved.

Second Exemplary Embodiment of Purge Process

In a second exemplary embodiment, the $CO_2$ gas (purge gas) is supplied from the purge gas source to the processing vessel 11 via the joint point 74, the second supply line 36, and the second discharge unit 22 (See FIG. 4B). In this case as well, the opening/closing valves V1, V2, V3 and V4 may be closed, and the states of the other opening/closing valves (opening/closing valves not directly involved in the flow of the fluid into/from the processing vessel) may not be particularly limited.

In this case, the $CO_2$ gas is introduced into the processing vessel 11 from the second discharge unit 22 to be flown toward the opening 11C of the processing vessel 11 as schematically indicated by the arrow F1 in FIG. 3, for example, and is then flown out from the opening 11C. According to the second exemplary embodiment, since the $CO_2$ gas is discharged from a position farthest from the opening 11C (a position where the distance from the opening 11C in the X direction is large) toward the opening 11C, the purging efficiency can be improved.

In the second exemplary embodiment as well, the gas collecting unit 28 and the curtain gas discharge unit 26 may be operated in the same way as in the first exemplary embodiment.

Third Exemplary Embodiment of Purge Process

In a third exemplary embodiment, the curtain gas discharge unit 26 is used as a purge gas discharge unit as well, and the first discharge unit 21 is used as a gas collecting unit. By closing the opening/closing valves V1, V2, V3, V6, V7 and V8) while opening the opening/closing valves V4 and V5, the first discharge unit 21 is connected to the drain line 38 via a part of the first supply line 34 and the bypass line 44, and a negative pressure can be applied to the first discharge unit 21. As a result, as indicated by an arrow F6 in FIG. 3, the $CO_2$ gas may be drained from the processing vessel 11 via the first discharge unit 21, and, along with this, the $CO_2$ gas discharged from the curtain gas discharge unit 26 may be introduced into the processing vessel 11. The $CO_2$ gas purging of the processing vessel 11 can be carried out in this way as well.

Fourth Exemplary Embodiment of Purge Process

In a fourth exemplary embodiment, the processing fluid ($CO_2$) supplied from the supercritical fluid supply device 30 is turned into the gas state to be used as the purge gas. By closing the opening/closing valves V2, V3 and V4 while opening the opening/closing valves V9 and V1, the $CO_2$ in the gas state can be discharged from the first discharge unit 21 into the processing vessel 11 as the purge gas, the same as in the initial period of the pressure increasing process. This fourth exemplary embodiment may be the same as the first embodiment except that the processing fluid ($CO_2$) supplied from the supercritical fluid supply device 30 is turned into the gas state to be used as the purge gas.

The purge gas obtained by gasifying the processing fluid supplied from the supercritical fluid supply device 30 into the processing vessel 11 can be discharged into the processing vessel 11 from the second discharge unit 22. In this case, however, since the filter FL2 which is not provided with the orifice OLF at the upstream thereof may be damaged by a pressure difference, it may be desirable to provide an appropriate pressure reducing device (for example, a valve capable of adjusting an opening degree thereof) at the upstream of the filter FL2.

When the fluid drain unit 24 is located near the opening 11C of the processing vessel 11, the fluid drain unit 24 can be used as the gas collecting unit in the first to fourth exemplary embodiments of the purge process. In this case, by opening the opening/closing valves V3 and V5 during the purge process and by fixing the opening degree of the adjusting valve 40 to an appropriately large opening degree, a suction force acts in the fluid drain unit 24. Further, in this case, the $CO_2$ gas discharged from the curtain gas discharge unit 26 is introduced into the processing vessel 11, and the $CO_2$ gas discharged from the first discharge unit 21 (or the second discharge unit 22) is also flown toward the fluid drain unit 24. Therefore, the gas purging of the processing vessel 11 can be performed without any problem.

[Timing of Purge Process End]

In one embodiment, if it is detected that the concentration of the $CO_2$ in the processing vessel 11 exceeds a predetermined threshold value (e.g., 80%), the controller 100 terminates the purge process, and moves the tray 12 on which the substrate W is placed to the closed position to accommodate the substrate W in the processing vessel 11 and close the opening 11C of the processing vessel 11. Thereafter, the controller 100 performs the pressure increasing process.

The $CO_2$ concentration can be detected by, for example, a $CO_2$ concentration meter (concentration sensor) provided in the processing vessel 11 or in the drain line 38 between processing vessel 11 and the opening/closing valve V3. In FIG. 4, the $CO_2$ concentration meter provided in the processing vessel 11 is indicated by an encircled S.

Instead of directly detecting the $CO_2$ concentration as stated above, if the $CO_2$ gas is supplied to the processing vessel 11 for a preset period of time, it may be considered that the $CO_2$ concentration exceeds a predetermined threshold value. Here "preset period of time" can be determined by an experiment performed by using an actual supercritical processing apparatus.

Desirably, the supply of the $CO_2$ gas (purge gas) into the processing vessel 11 is carried on until just before the tray 14 holding the substrate W is moved to the closed position. In addition, it is also possible to move the tray 14 holding the substrate W to the closed position while continuing to supply the $CO_2$ gas into the processing vessel 11 at a flow rate that does not have any adverse effect on the IPA puddle on the substrate W.

First Modification Example of Processing Unit

Figure 6:
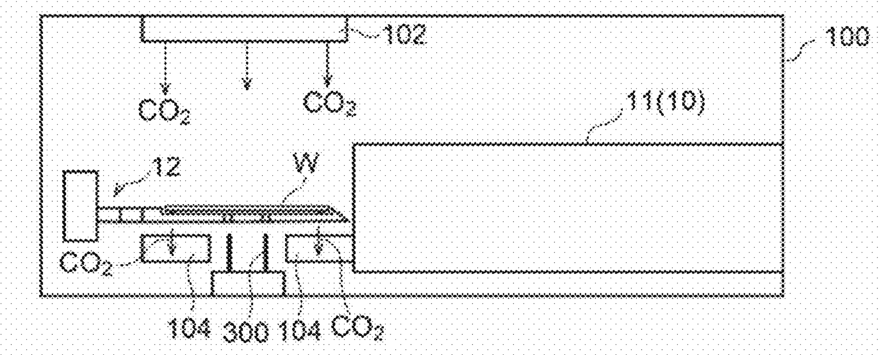
FIG. 6 is a schematic side view illustrating a configuration example within a housing in which the supercritical drying unit is accommodated.

As illustrated in FIG. 6, a device configured to set a $CO_2$ gas atmosphere around the opening 11C of the processing vessel 11 may be provided. In a configuration example shown in FIG. 6, a gas discharge unit 102 is disposed within the housing 100 (for example, at a ceiling of the housing 100) surrounding the processing unit 10. The gas discharge unit 102 is located above the tray 12 placed at the open position, and is capable of discharging a $CO_2$ gas downwards toward the tray 12. This downflow of the $CO_2$ gas from the gas discharge unit 102 turns the space around the opening 11C of the processing vessel 11 into a $CO_2$ gas atmosphere. Thus, in this case, the curtain gas discharge unit 26 need not be provided. This configuration is advantageous in that the impurity gas, which is introduced into the processing vessel 11 during the period until the tray 12 having the substrate W placed thereon is moved to the closed position after the supply of the $CO_2$ gas (purge gas) into the processing vessel 11 is stopped, is reduced.

A gas collecting unit 104 is provided below the tray 12 placed at the open position to collect the gas in the housing 100. Therefore, it is possible to suppress the $CO_2$ gas of the high concentration from leaking to the outside of the housing 100. In case of providing the gas collecting unit 104, the gas collecting unit 28 may be omitted. The gas collecting units 28 and 104 are provided for the main purpose of complying with the safety regulations related to harmful gases, and how to collect the $CO_2$ gas is not particularly limited.

It is also possible to discharge clean air from the gas discharge unit 102. When it is necessary to set the inside of the housing 100 into an atmosphere harmless to the human body during maintenance or the like, the inside of the housing 100 can be air-purged by collecting the gas with the gas collecting unit 104 while discharging the clean air from the gas discharge unit 102.

When the configuration of FIG. 6 is adopted, the space around the opening 11C of the processing vessel 11 can be set into the $CO_2$ gas atmosphere. Therefore, the purge process according to the first to fourth exemplary embodiment, especially, the purge process according to the third exemplary embodiment can be performed efficiently. In case of the purge process according to the third exemplary embodiment, by sucking the atmosphere in the processing vessel 11 from the first discharge unit 21, the $CO_2$ gas around the opening 11C can be introduced into the processing vessel 11, so that the $CO_2$ gas purging of the inside of the processing vessel 11 can be carried out.

Further, the members shown by the reference numeral 300 in FIG. 6 are the lift pins capable of lifting up the substrate W on the tray 12. The lift pins 300 can be moved up and down through the through holes 18 of the tray 12. The substrate W lifted above the tray 12 by the lift pins may be received by the non-illustrated substrate transfer arm which has advanced into the housing 100. In the carry-in of the substrate W, the non-illustrated substrate transfer arm may place the substrate W on the lift pins 300 located at the raised position. Then, by lowering the lift pins 300 to below the tray 12, the substrate W can be placed on the tray 12.

Second Modification Example of Processing Unit

Figure 7:
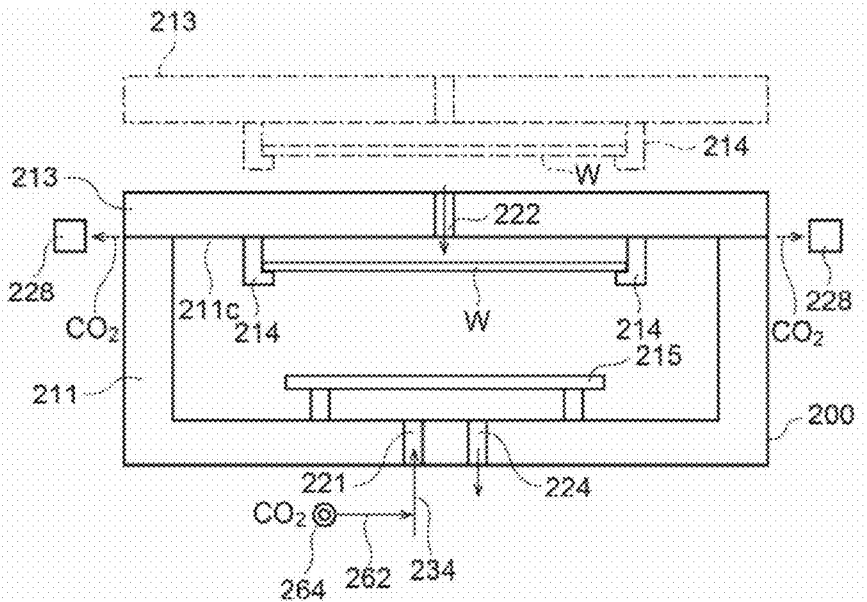
FIG. 7 is a schematic longitudinal sectional view illustrating another configuration of the supercritical drying unit.

FIG. 7 shows a second modification example of the processing unit. In FIG. 7, reference numerals obtained by adding 200 to reference numerals indicating components that play the same roles as those of the exemplary embodiments shown in FIG. 1 to FIG. 4 are used.

A processing unit 200 shown in FIG. 7 includes a cylindrical processing vessel 211 having an opening 211C at an upper end thereof, and a movable cover body 213 configured to close the opening 211C of the processing vessel 211. The cover body 213 is provided with a substrate holder 214 which is configured to hold the substrate W. In FIG. 7, the cover body 213 located at a closed position is indicated by a solid line, and the cover body 213 placed at an open position is indicated by a dashed line. When the cover body 213 is located at the open position, the substrate W can be transferred between the substrate holder 214 and a non-illustrated substrate transfer arm. The supercritical drying processing is performed in the state that the cover body 213 holding the substrate W with the substrate holder 214 is placed at the closed position.

A first discharge unit 221 and a fluid drain unit 224 are provided at the bottom of the processing vessel 211. The cover body 213 is provided with a second discharge unit 222. A baffle plate 215 is provided above the first discharge unit 221 to suppress the processing fluid discharged from the first discharge unit 221 from directly flowing to the substrate W. In the supercritical drying processing, the first discharge unit 221 has the same role as the first discharge unit 21 of the above-described processing unit 10; the second discharge unit 222 has the same role as the first discharge unit 22 of the above-described processing unit 10; and the fluid drain unit 224 has the same role as the fluid drain unit 24 of the above-described processing unit 10.

In the processing unit 200 shown in FIG. 7, the same $CO_2$ purging as that performed by the above-described processing unit 10 can be carried out. For this purpose, a gas line 262 may be connected to a supply line 234 through which the processing fluid (supercritical $CO_2$) to the first discharge unit 221 is supplied. With the cover body 213 placed at the open position, the $CO_2$ gas supplied from a $CO_2$ gas source 264 via the gas line 262 and the supply line 234 is discharged into the processing vessel 211 from the first discharge unit 221. Accordingly, the inside of the processing vessel 211 can be gas-purged. At this time, a gas collecting unit 228 is provided around a gap between the opening 211C of the processing vessel 211 and the cover body 213 to collect the $CO_2$ gas leaking from the gap.

It should be noted that the above-described exemplary embodiment is illustrative in all aspects and is not anyway limiting. The above-described exemplary embodiment may be omitted, replaced and modified in various ways without departing from the scope and the spirit of claims.

The substrate is not limited to the semiconductor wafer, and any of various other types of substrates, such as a glass substrate and a ceramic substrate, for use in the manufacture of semiconductor devices, may be used.

According to the exemplary embodiment, it is possible to reduce the impurities present on the front surface of the substrate after being processed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus configured to dry a substrate, a liquid being accumulated on a front surface of the substrate, by using a supercritical drying technique, the substrate processing apparatus comprising:

a processing vessel having an opening through which the substrate is carried into or carried out of the processing vessel;

a cover body configured to be moved and configured to close the opening of the processing vessel;

a cover body moving mechanism configured to move the cover body between a closed position where the cover body closes the opening and an open position where the cover body opens the opening;

a substrate holder configured to horizontally hold the substrate with the front surface facing upwards in the processing vessel;

a fluid supply device configured to supply a processing fluid in a supercritical state and a processing fluid in a gas state composed of a same material as the processing fluid in the supercritical state to the processing vessel, the fluid supply device comprising at least one supply line and at least one flow control device; and a controller configured to control the fluid supply device such that the processing fluid in the supercritical state is supplied to the processing vessel in a first state in which the substrate is held by the substrate holder within the processing vessel and the cover body is located at the closed position, and such that the processing fluid in the gas state is supplied to the processing vessel in a second state in which the substrate is not held by the substrate holder within the processing vessel and the cover body is located at the open position, wherein a first fluid supply configured to send the processing fluid in the supercritical state and a second fluid supply configured to send the processing fluid in the gas state which is the same material as the processing fluid sent from the first fluid supply are connected to the fluid supply device, the first fluid supply and the second fluid supply being connected to different fluid sources, and the controller controls the fluid supply device such that the processing fluid is supplied to the processing vessel from the first fluid supply in the first state and the processing fluid in the gas state is supplied to the processing vessel from the second fluid supply in the second state, wherein the processing vessel comprises a first discharge unit configured to discharge the processing fluid toward the opening from a position far from the opening, the first discharge unit is connected to the at least one supply line, and the controller controls the fluid supply device such that the processing fluid in the gas state is supplied to the processing vessel via the first discharge unit in the second state.

2. The substrate processing apparatus of claim 1, wherein the at least one supply line included in the fluid supply device comprises a gas line connected to the second fluid supply and a first supply line through which the processing fluid sent from the first fluid supply in the first state is supplied to the processing vessel, and the gas line is connected to the first supply line, and the controller controls the fluid supply device such that the processing fluid in the gas state is supplied to the processing vessel from the second fluid supply via the gas line and the first supply line in the second state.

3. The substrate processing apparatus of claim 1, wherein the controller controls the fluid supply device such that the processing fluid is supplied to the processing vessel after the first state is created by carrying the substrate into the processing vessel and closing the cover body after the processing fluid in the gas state is supplied to the processing vessel in the second state.

4. The substrate processing apparatus of claim 1, further comprising:

a fluid collecting unit disposed near the opening, and configured to suck and collect the processing fluid in the gas state flown out or to be flown out from the opening after being supplied to the processing vessel.

5. The substrate processing apparatus of claim 4, wherein the processing vessel is configured to allow the substrate to be carried in or out in horizontally through the opening, the fluid collecting unit is disposed below a movement trajectory of the substrate when the substrate is carried in or out of the processing vessel, and the processing fluid in the gas state flown out from the opening is flown downwards into the fluid collecting unit.

6. The substrate processing apparatus of claim 1, further comprising:

a curtain gas discharge unit configured to discharge the processing fluid near the opening to form a gas curtain configured to suppress exterior air from being introduced into the opening.

7. The substrate processing apparatus of claim 1, further comprising:

a concentration sensor configured to measure a concentration of the processing fluid within the processing vessel, wherein the controller controls the fluid supply device to stop a supply of the processing fluid in the gas state to the processing vessel when a value detected by the concentration sensor when the processing fluid in the gas state is supplied to the processing vessel in the second state is equal to or larger than a preset threshold value.

8. The substrate processing apparatus of claim 1, further comprising:

a concentration sensor configured to measure a concentration of the processing fluid in the processing vessel, wherein the controller controls the cover body moving mechanism to move the cover body to the closed position to thereby shift the second state to the first state when a value detected by the concentration sensor when the processing fluid in the gas state is supplied to the processing vessel in the second state is equal to or larger than a preset threshold value.

9. The substrate processing apparatus of claim 1, wherein the cover body and the substrate holder are coupled as one body, and the substrate held by the substrate holder is carried into the processing vessel by moving the cover body to the closed position.

10. The substrate processing apparatus of claim 9, wherein a direction in which the substrate held by the substrate holder is carried into the processing vessel is a horizontal direction.

11. The substrate processing apparatus of claim 9, wherein the processing vessel has the opening at an upper end thereof, and a direction in which the substrate held by the substrate holder is carried into the processing vessel is a vertical direction.

12. The substrate processing apparatus of claim 11, further comprising:

a fluid collecting unit disposed around the opening, and configured to collect the processing fluid in the gas state flown out from the opening after being supplied to the processing vessel, when the cover body is located at the open position.

13. A substrate processing method performed by a substrate processing apparatus comprising: a processing vessel having an opening through which a substrate is carried into or out of the processing vessel; a cover body configured to be moved and configured to close the opening of the processing vessel; a substrate holder configured to hold the substrate horizontally with a front surface of the substrate facing upwards; a fluid supply device configured to supply a processing fluid in a supercritical state and a fluid in a gas state composed of a same material as the processing fluid in the supercritical state to the processing vessel, the fluid supply device comprising at least one supply line and at least one flow control device, wherein a first fluid supply configured to send the processing fluid in the supercritical state and a second fluid supply configured to send the processing fluid in the gas state which is the same material as the processing fluid sent from the first fluid supply are connected to the fluid supply device, the first fluid supply and the second fluid supply being connected to different fluid sources, the substrate processing method comprising:

controlling the fluid supply device such that the processing fluid is supplied to the processing vessel from the first fluid supply in the first state, thereby flowing the processing fluid in the supercritical state in the processing vessel in a state that the substrate on the front surface of which a liquid is accumulated is carried in the processing vessel by the substrate holder, and replacing the liquid with the processing fluid in the supercritical state; and controlling the fluid supply device such that the processing fluid in the gas state is supplied to the processing vessel from the second fluid supply in the second state, thereby supplying, before the flowing of the processing fluid in the supercritical state and the replacing of the liquid with the processing fluid in the supercritical state, a purge gas into the processing vessel to turn an inside of the processing vessel into a purge gas atmosphere, when the cover body keeps the opening opened to carry the substrate into the processing vessel, wherein the purge gas and the processing fluid are composed of a same material and have different phases, wherein the processing vessel comprises a first discharge unit configured to discharge the processing fluid toward the opening from a position far from the opening, the first discharge unit is connected to the at least one supply line, and the substrate processing method further comprises:

controlling the fluid supply device such that the processing fluid in the gas state is supplied to the processing vessel via the first discharge unit in the second state.

14. The substrate processing method of claim 13, wherein the substrate is carried into the processing vessel and the cover body is closed after a supply of the purge gas into the processing vessel is stopped, and, then, the flowing of the processing fluid in the supercritical state and the replacing of the liquid with the processing fluid in the supercritical state are performed.

15. The substrate processing method of claim 14, wherein the supply of the purge gas into the processing vessel is stopped and the substrate is carried into the processing vessel when a purge gas concentration detected by a concentration sensor is equal to or larger than a preset threshold value.

16. The substrate processing method of claim 13, wherein the supplying of the purge gas comprises sucking and collecting the purge gas flown out or to be flown out from the opening after being supplied into the processing vessel.

17. The substrate processing method of claim 13, wherein, in the supplying of the purge gas, the purge gas is supplied from a purge gas source to a supply line through which the processing fluid in the supercritical state is supplied to the processing vessel, and the purge gas is supplied into the processing vessel through the supply line.

* * * * *